United States Patent
Tornblad et al.

(10) Patent No.: US 7,626,233 B2
(45) Date of Patent: Dec. 1, 2009

(54) LDMOS DEVICE

(75) Inventors: Olof Tornblad, Los Gatos, CA (US); Gordon Ma, Phoenix, AZ (US)

(73) Assignee: Infineon Technologies AG, Neubiberg (DE)

( * ) Notice: Subject to any disclaimer, the term of this patent is extended or adjusted under 35 U.S.C. 154(b) by 156 days.

(21) Appl. No.: 11/738,603

(22) Filed: Apr. 23, 2007

(65) Prior Publication Data

US 2008/0258215 A1 Oct. 23, 2008

(51) Int. Cl.
*H01L 29/94* (2006.01)
*H01L 29/76* (2006.01)
(52) U.S. Cl. .............. 257/343; 257/335; 257/339; 257/E29.027; 438/197
(58) Field of Classification Search .......... 257/327, 257/335, 339, 343, E21.417, 336, 341, 342, 257/344, 355, 408, 409, 493, E29.256, E29.027; 438/197
See application file for complete search history.

(56) References Cited

U.S. PATENT DOCUMENTS

| | | | |
|---|---|---|---|
| 4,811,075 A | 3/1989 | Eklund | |
| 5,313,082 A | 5/1994 | Eklund | |
| 5,981,997 A * | 11/1999 | Kitamura | 257/335 |
| 6,144,070 A | 11/2000 | Devore et al. | |
| 6,168,983 B1 | 1/2001 | Rumennik et al. | |
| 6,448,625 B1 * | 9/2002 | Hossain et al. | 257/493 |
| 6,563,171 B2 | 5/2003 | Disney | |
| 6,858,884 B2 | 2/2005 | Udrea | |
| 6,911,696 B2 | 6/2005 | Denison | |
| 6,919,598 B2 | 7/2005 | Hossain et al. | |
| 6,989,567 B2 | 1/2006 | Tornblad et al. | |
| 7,365,402 B2 | 4/2008 | Ma | |

OTHER PUBLICATIONS

Cai, Jun et al. "A Novel High Performance Stacked LDD RF LDMOSFET." IEEE Electron Device Letters, vol. 22, No. 5, May 2001, pp. 236-238.
Deboy, G. et al. "A New Generation of High Voltage MOSFETs Breaks the Limit Line of Silicon." International Electon Devices Meeting, 1998. IEDM '98 Technical Digest., Dec. 6-9, 1998, pp. 683-685.
Fujihira, Tatsuhiko. "Theory of Semiconductor Superjunction Devices." Jp. J. Appl. Phys., vol. 36, pp. 6254-6262, Part 1, No. 10, Oct. 1997.
Ludikhuize, Adriaan W. "A Review of Resurf Technology." The 12th International Symposium on Power Semiconductor Devices and ICs, 2000. Proceedings. May 22-25, 2000, pp. 11-18.
"Polyfet RF Devices—LDMOS—Lateral Double Diffuse MOS Transistor—The Next Generation." Available at: http://www.polyfet.com/.

* cited by examiner

*Primary Examiner*—Sue Purvis
*Assistant Examiner*—Scott Stowe
(74) *Attorney, Agent, or Firm*—Coats & Bennett, P.L.L.C.

(57) ABSTRACT

An LDMOS transistor comprises source, channel and extended drain regions. The extended drain region comprises a plurality of islands that have a conductivity type that is opposite to the extended drain region. The islands have a depth less than a depth of the extended drain region.

18 Claims, 6 Drawing Sheets

LDMOS DEVICE

BACKGROUND OF THE INVENTION

The present invention generally relates to laterally diffused metal oxide semiconductor (LDMOS) transistors, and particularly relates to LDMOS transistors having extended drain regions.

LDMOS transistors are typically formed in an epitaxial layer deposited or grown on a semiconductor substrate. An LDMOS transistor has a source region separated from an extended drain region by a channel. The dopant distribution in the channel region is formed by lateral diffusion of dopants from the source side of the channel region, forming a laterally graded channel region. The source region and extended drain region are of the same conductivity type (e.g., n-type) while the epitaxial layer and the channel-region are of the opposite conductivity type (e.g., p-type). A gate actuates the LDMOS transistor. LDMOS transistors are used extensively in RF applications because of their advantageous linearity, power gain and breakdown voltage characteristics.

The extended drain region of an LDMOS device enables the device to withstand high breakdown voltages. The extended drain region includes an elongated drift region extending one or more microns from a highly-doped drain contact region to the channel. The elongated drift region conventionally has a lower conductivity than the highly-doped drain contact region. The elongated drift region drops most of the voltage applied to the drain, thus improving the breakdown voltage tolerance of the LDMOS transistor. The extended drain region may also include a region more lightly-doped than the drift region extending from the drift region to the channel for reducing hot electron injection near the gate region of the transistor. However, high electric fields still arise in the LDMOS transistor, particularly in two regions—laterally along the depletion region formed between the drift region and the p-well region near the channel and also vertically between the drain contact region and the epitaxial layer. High electric fields in these regions of an LDMOS transistor can cause punchthrough, avalanche breakdown, or other destructive effects, thus limiting the breakdown voltage capability of the transistor.

Ideally, at the point of maximum (breakdown) voltage, the extended drain region of an LDMOS transistor is fully depleted of charge carriers. High electric fields in the LDMOS transistor are reduced when the extended drain region is fully depleted. Electric fields in an LDMOS transistor are more evenly dispersed over the length of the extended drain region when the extended drain region is fully depleted. Accordingly, the breakdown voltage of an LDMOS transistor is greatest when the extended drain region is fully depleted. The extended drain region may be depleted by lightly-doping the elongated drift portion of the extended drain. However, a lightly-doped drift region increases the on-state resistance of the LDMOS device which degrades RF performance.

Some previously presented structures provide a more fully-depleted extended drain region. For example, a dopant of the opposite conductivity as the drain may be implanted into the elongated drift region to form a continuous layer of opposite conductivity above the drift region. Previous continuous top layers deplete the extended drift region from above the extended drain region only and reduce the conduction path of the drift region because they extend over the entire width of the drift region. A similar layer may be formed below the elongated drift region, thus depleting the extended drain region from both the top and bottom. In another conventional approach, the continuous top layer is segmented into a plurality of stripes extending in parallel over the length of the drift region, adjacent stripes being separated by the drift region. The stripes extend below the extended drain region into the epitaxial layer or even further into the substrate and thus deplete the drain region from the sides only while further reducing the conduction path of the elongated drift region.

SUMMARY OF THE INVENTION

According to the methods and apparatus taught herein, one embodiment of an LDMOS transistor comprises source, channel and extended drain regions. The extended drain region comprises a plurality of islands that have a conductivity type that is opposite to the extended drain region. The islands have a depth less than a depth of the extended drain region.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
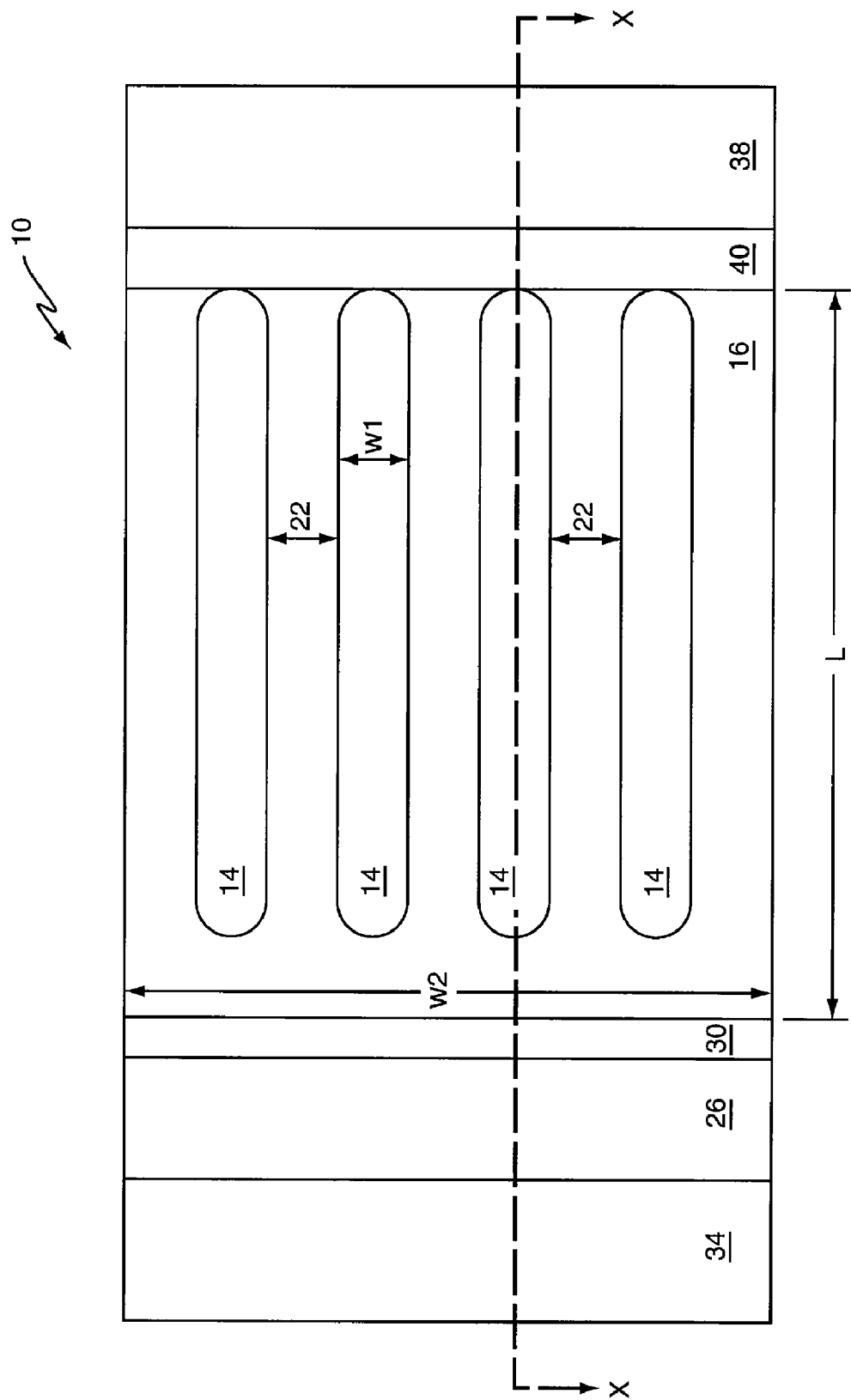
FIG. 1 is a top-down view of one embodiment of an LDMOS transistor structure having depletion-inducing islands.
Figure 2:
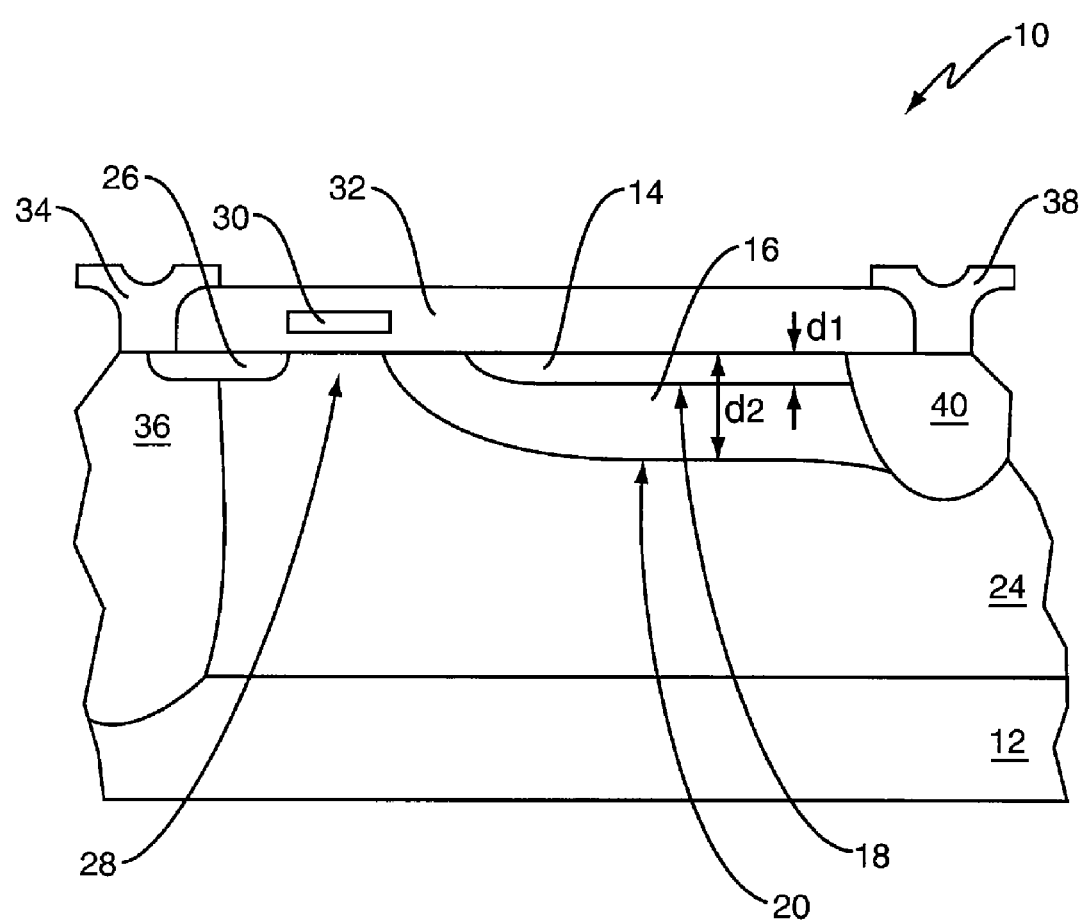
FIG. 2 is a cross-sectional view of the LDMOS transistor structure of FIG. 1.

FIG. 1 illustrates a top-down view of one embodiment of a laterally diffused metal oxide semiconductor (LDMOS) transistor structure 10. FIG. 2 illustrates a cross-sectional view of the LDMOS transistor structure 10 along the line labeled 'X' in FIG. 1. The LDMOS transistor structure 10 is formed in a semiconductor substrate 12 such as a Si substrate and has a plurality of islands 14 disposed in an extended drain region 16 of the LDMOS transistor 10. The islands 14 are of the opposite conductivity type than the extended drain region 16, i.e., the extended drain region 16 has free negative charge carriers (n-type) while the islands 14 have free positive charge carriers (p-type). In other embodiments, the extended drain region 16 has free positive charge carriers (p-type) and the islands 14 have free negative charge carriers (n-type). The extended drain region 16, together with a drain contact region 40, surround each island 14, electrically isolating the islands 14 from each other and from an epitaxial region 24 and substrate 12. The islands 14 collectively improve the breakdown voltage tolerance of the LDMOS transistor 10 without sacrificing transistor performance. In some embodiments, the islands 14 deplete the extended drain region 16 of charge carriers in three dimensions, thus allowing the extended drain region 16 to have a higher doping concentration which reduces drain resistance. In some embodiments, the islands 14 deplete the extended drain region 16 of charge carriers in one dimension or in two dimensions.

In the illustrated embodiments, the islands 14 deplete the extended drain region 16 in three dimensions because their bottom surfaces 18 do not extend below a bottom surface 20 of the extended drain region 16. Instead, the islands 14 are contained within the extended drain region 16 in that the islands 14 have a depth d1 less than a depth d2 of the extended drain region 16. Accordingly, each island 14 forms a double p-n junction with the surrounding drain region 16. A first p-n junction is formed between side surfaces 22 of each island 14 and the area of the extended drain region 16 adjacent the island side surfaces 22. A second p-n junction is formed between the bottom surface 18 of each island 14 and the area of the extended drain region 16 adjacent the island bottom surfaces 18. This way, the islands 14 deplete the extended drain region 16 in three dimensions, i.e., along the length (L), width (W2) and depth (d2) of the extended drain region 16. In some embodiments, the islands 14 are sufficiently doped so that the extended drain region 16 first depletes vertically and then laterally. This allows the electric field present in the LDMOS device 10 to build up uniformly in a lateral direction, thus improving the breakdown voltage tolerance of the LDMOS transistor 10.

In the illustrated embodiments, the islands 14 deplete the extended drain region 16 vertically first and then uniformly horizontally when the total charge of the islands 14 approximately equals the total charge of the extended drain region 16. The preferred doping concentration of the islands 14 is a function of island dimension (width, length and depth) as well as the doping concentration of the extended drain region 16. In the embodiment shown in FIGS. 1 and 2, the islands 14 are formed as narrow, shallow stripes extending over a substantial length of the extended drain region 16. The shallow depth d1 and narrow width W1 of the islands 14 results in a high peak island doping concentration, e.g., approximately $10^{17}$ $cm^{-3}$ to $10^{18}$ $cm^{-3}$. In other embodiments, the islands 14 may be wider and/or deeper, and thus, may be less heavily doped. In the illustrated embodiments, the doping concentration of the islands 14 is high enough to ensure sufficient vertical and horizontal depletion of the extended drain region 16. The breakdown voltage capability of the LDMOS transistor 10 is enhanced when the extended drain region 16 is fully depleted.

In the illustrated embodiments, performance of the LDMOS transistor 10 is not reduced when the extended drain region 16 is not fully depleted. To the contrary, the current carrying capability of the extended drain region 16 is improved over conventional structures. The shape of the islands 14 increases the conduction path of the extended drain region 16 in that the islands 14 do not extend over the entire width of the extended drain region 16. Thus, current flowing in the extended drain region 16 is able to flow around and between the islands 14. In some embodiments, current flowing in the extended drain region 16 also flows below the islands 14 because the islands 14 have a depth d1 that is less than a depth d2 of the extended drain region 16. Simulation results show the conduction path of the extended drain region 16 is significantly increased by using the electrically-isolated islands 14 over conventional structures, e.g., by 25% or more. Accordingly, the extended drain region 16 may be more heavily doped.

Figure 3:
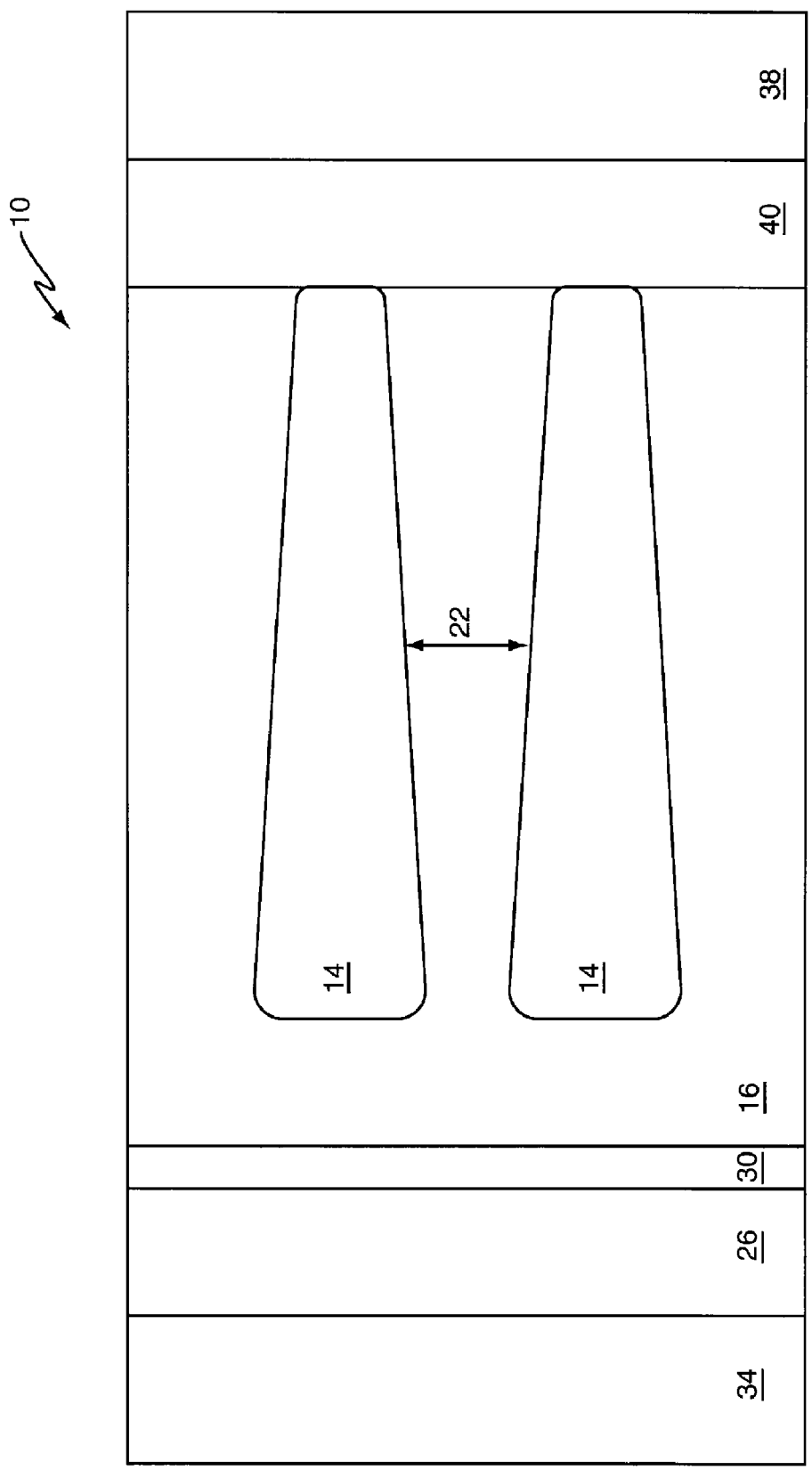
FIG. 3 is a top-down view of the LDMOS transistor structure of FIG. 1 wherein the islands have a trapezoidal-shape.

In the illustrated embodiments, the islands 14 may have any suitable shape for depleting the extended drain region 16 in one or more dimensions. In one embodiment, the islands 14 extend substantially in parallel over a substantial length L of the extended drain region 16 as shown in FIG. 1. The islands 14 may have a substantially rectangular shape as shown in FIG. 1. In some embodiments, the corners of the rectangular islands 14 are rounded to reduce electric field build-up. In other embodiments, the islands 14 have a substantially oval shape. In yet other embodiments, the islands 14 have a substantially trapezoidal shape as shown in FIG. 3. Again, in some embodiments, the island corners have a slight rounding to reduce high electric fields. In other embodiments, each island 14 may have an irregular shape. Those skilled in the art will readily recognize the shape and dimensions (length, width, and depth) of the islands 14 are in part a function of the capabilities of the equipment used to fabricate the LDMOS transistor 10. In some embodiments, the islands 14 may be of any shape suitable for depleting the extended drain region 16 in three dimensions while allowing current to flow around, between and below the islands 14. In other embodiments, the islands 14 may be of any shape suitable for depleting the extended drain region 16 in one dimension or in two dimensions.

For ease of explanation only, the LDMOS transistor structure 10 is described next in more detail as an n-MOS device. However, those skilled in the art will readily recognize the LDMOS transistor structure 10 may also be of the p-MOS type. Thus, the particular dopants described herein should be considered exemplary and not limiting.

In the illustrated embodiments, the transistor structure 10 is formed in a p-type substrate 12. In one embodiment the substrate 12 is heavily doped, e.g., with approximately $10^{19}$ $cm^{-3}$ Boron atoms. A less heavily doped epitaxial layer 24 may be deposited or 'grown' on the substrate 12. In one embodiment, the epitaxial layer 24 is p-type and has a doping concentration of approximately $10^{15}$ $cm^{-3}$. The extended drain region 16 and a source region 26 are formed in the epitaxial layer 24, e.g., by ion implantation with an n-type dopant. In various embodiments, the dopants can include Phosphorous or Arsenic.

A channel region 28 separates the source and drain regions 26, 16. A gate 30 is formed over the channel region 28. A dielectric layer 32, such as $SiO_2$, is formed over the surface of the epitaxial layer 24. A gate electrode that connects to gate 30 is not shown in FIG. 1 for ease of illustration. The gate 30 inverts the channel 28 in response to an applied positive voltage, causing the LDMOS transistor 10 to conduct. A source electrode 34 connects the source region 26 to a p-type sinker region 36. The p-type sinker region 36 extends from the source region 26 to the substrate 12. The backside of the substrate 12 has a metal contact layer (not shown) for contacting the source region 26. A second electrode 38 contacts a highly-doped $n^+$ region 40 adjacent the extended drain region 16. The highly-doped $n^+$ drain contact region 40 has a doping concentration of approximately $10^{19}$ $cm^{-3}$.

In the present embodiment, the extended drain region 16 comprises a single elongated region extending from the highly-doped $n^+$ drain contact region 40 to the channel 28. The extended drain region 16 may be formed by implanting n-type donor atoms into the epitaxial layer 24. The islands 14 are then formed in the extended drain region 16 by implanting p-type donor atoms into the extended drain region 16. The ion implantation process may be tailored to form islands 14 having desired dimensions. For example, the dose, energy, temperature and location of implantation may be tailored as desired. In the illustrated embodiments, the extended drain region 16 electrically isolates the islands 14 from each other and from the epitaxial region 24 and substrate 12 because the islands 14 are shallower than the extended drain region 16. In some embodiments, the combined total doping concentration of the islands 14 approximates the doping concentration of the extended drain region 16 disposed between the channel 28 and the highly-doped n+ drain contact region 40. In these embodiments, the islands 14 deplete the extended drain region 16 uniformly in three dimensions and permit the extended drain region 16 to have a higher doping concentration.

Figure 4:
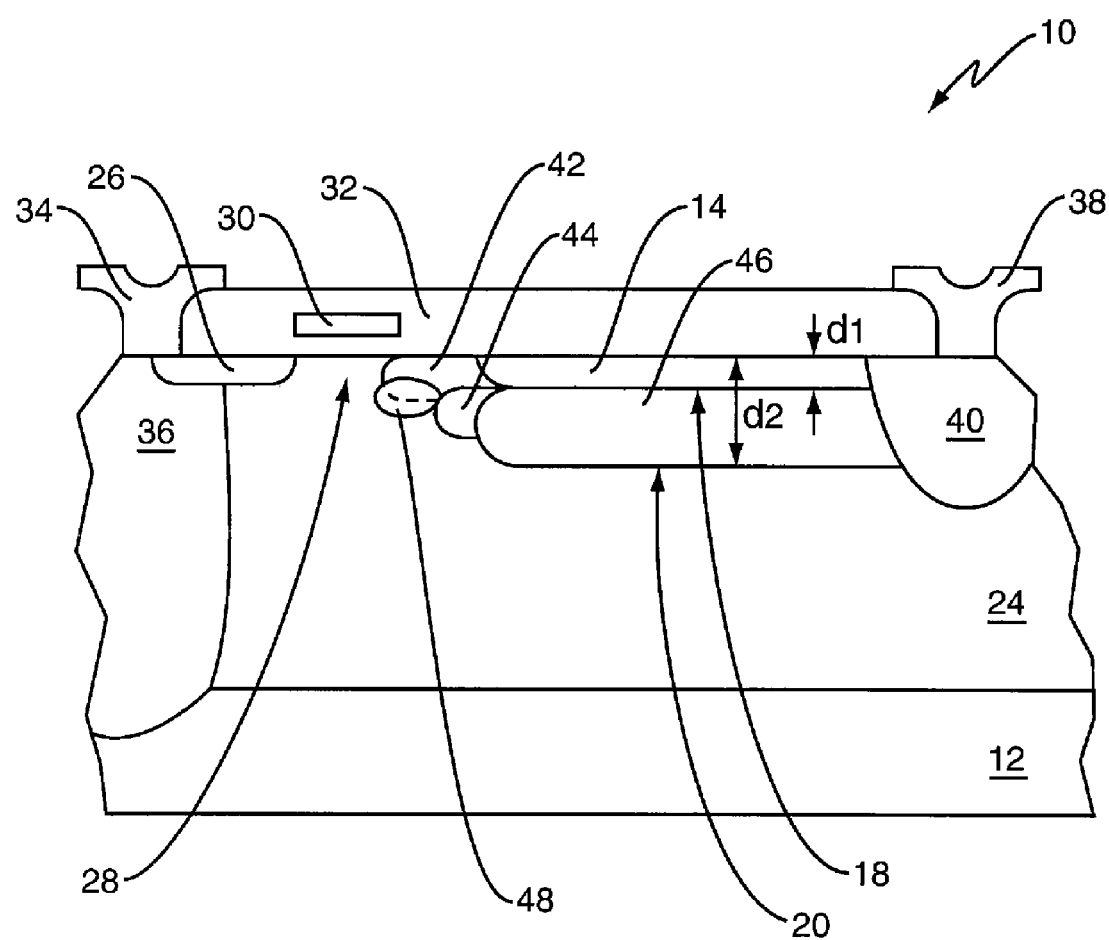
FIG. 4 is a cross-sectional view of another embodiment of an LDMOS transistor structure having depletion-inducing islands.

FIG. 4 illustrates a cross-sectional view of another embodiment of the LDMOS transistor structure 10 where the extended drain region 16 comprises multiple segments 42, 44, 46 of varying dopant concentrations. The multi-segment extended drain region 42, 44, 46 has a graded doping concentration that further reduces electric field build-up near the channel 28. That is, the multi-segment extended drain region 42, 44, 46 may have a lower doping concentration near the channel 28 for reducing hot-carrier injection near the gate 30. The doping concentration progressively increases moving away from the channel 28 toward the highly-doped n+ drain contact region 40 for reducing overall drain resistance.

In this embodiment, a first relatively short segment 42 is lightly-doped n− and extends from the channel 28 toward the heavily-doped n+ drain contact region 40. A second lightly-doped n− segment 44 extends deeper into the epitaxial layer 24 from the first segment 42 and toward the heavily-doped n+ drain contact region 40. An elongated third segment 46 extends from the second segment 44 to the heavily-doped n+ drain contact region 40. The islands 14 are formed in the elongated (third) segment 46 according to this embodiment. In one embodiment, the islands 14 are formed by implanting p-type donor atoms. In other embodiments, one or more of the islands 14 are formed in any one or more of the first segment 42, the second segment 44 or the third segment 46.

In the illustrated embodiment, the elongated (third) segment 46 is more heavily doped than the first and second segments 42, 44, but less heavily doped than the highly-doped n+ drain contact region 40. In the illustrated embodiments, the doping concentration gradually increases from the channel 28 moving toward the heavily-doped n+ drain contact region 40. In these embodiments, the combined charge of the islands 14 approximates the total charge of the elongated (third) segment 46 of the multi-segment extended drain region 42, 44, 46.

In one embodiment, a p-type region 48 is implanted below the first lightly-doped n− segment 42 of the multi-segment extended drain region 42, 44, 46. The p-type region 48 provides a 'pocket' of p-type donor atoms near the channel 28 just below the first lightly-doped n− segment 42. The p-type 'pocket' 48 reduces channel length modulation and hot carrier velocity, thus improving transistor reliability.

Figure 5:
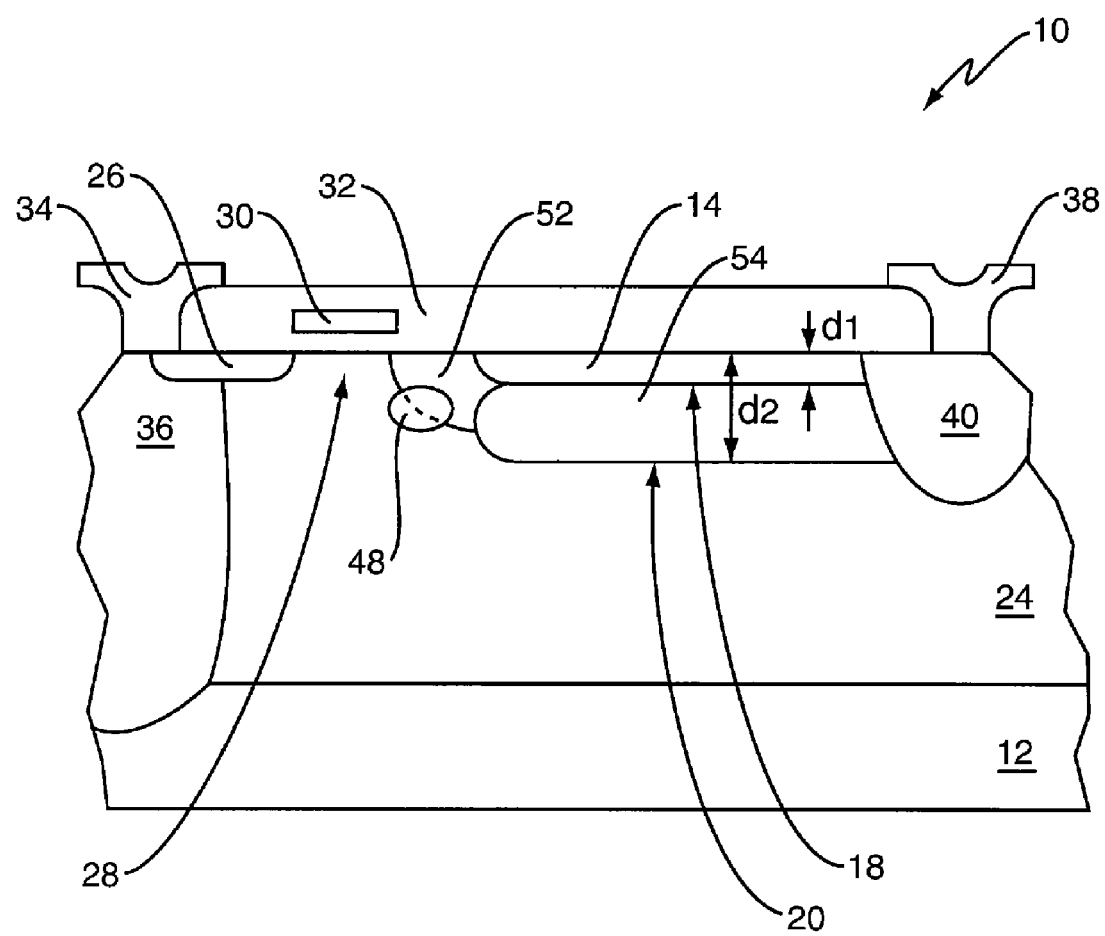
FIG. 5 is a cross-sectional view of yet another embodiment of an LDMOS transistor structure having depletion-inducing islands.

FIG. 5 illustrates a cross-sectional view of still another embodiment of the LDMOS transistor structure 10 where the extended drain region 16 is divided into two segments 52, 54. The first segment 52 is adjacent the channel 28 and is lightly-doped n− to reduce hot electron injection near the gate 30. The second segment 54 is more heavily doped n and extends deeper into the epitaxial layer 24 from the first segment 52 to the highly-doped n+ drain contact region 40. In these embodiments, the drain doping concentration gradually increases moving laterally away from the channel 28 toward the heavily-doped n+ drain contact region 40. This way, hot electron injection is reduced near the gate 30. The islands 14 are formed above the second, elongated segment 54 according to this embodiment. In other embodiments, one or more of the islands 14 are formed over the first segment 52 and the second segment 54. In some embodiments, the p-type 'pocket' 48 is implanted below the first segment 52 of the extended drain region 52, 54.

Figure 6:
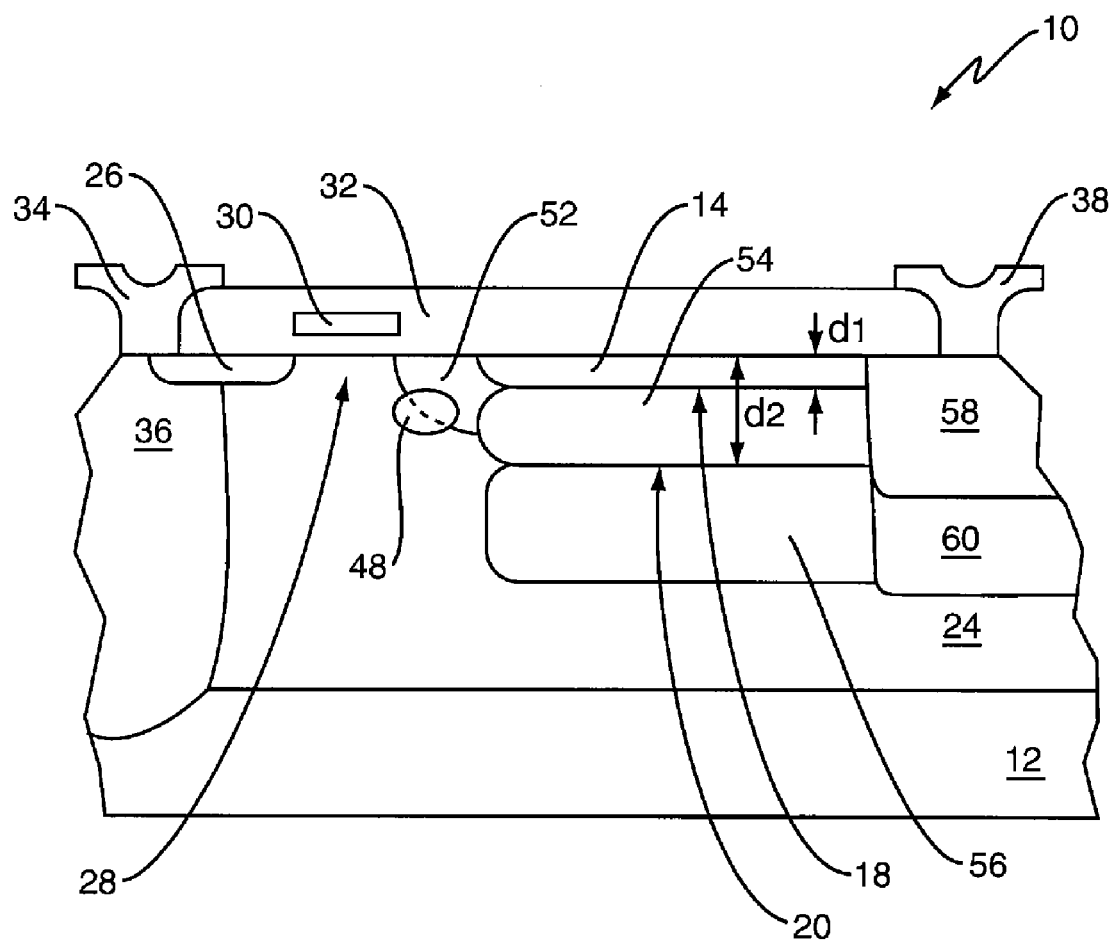
FIG. 6 is a cross-sectional view of still another embodiment of an LDMOS transistor structure having depletion-inducing islands.

FIG. 6 illustrates a cross-sectional view of yet embodiment of the LDMOS transistor structure 10. This embodiment is similar to the embodiment illustrated in FIG. 5 in that the extended drain region 16 is divided into two segments 52, 54. However, in this embodiment, the elongated segment 54 is formed using a double implantation process. As a result, another elongated n-type region 56 is formed below the first elongated segment 54. In some embodiments, the drain contact region is also formed using a double implantation process. Accordingly, the drain contact region comprises two heavily doped n+ regions 58, 60. The double implantation process further extends the drain region vertically into the epitaxial layer 24, thus reducing current crowding.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An LDMOS transistor, comprising:
   a source region;
   a channel region;
   an extended drain region comprising a first segment extending from the channel region toward a drain contact region, a second segment extending deeper than the first segment toward the drain contact region and a third segment extending from the second segment to the drain contact region, the first segment being more lightly doped than the second segment and the second segment being more lightly doped than the third segment; and
   a plurality of islands formed in the third segment of the extended drain region that have a conductivity type that is opposite to the extended drain region, the islands having a depth less than a depth of the extended drain region.

2. The LDMOS transistor of claim 1, wherein the islands have an irregular shape.

3. The LDMOS transistor of claim 1, wherein the islands have a substantially trapezoidal shape.

4. The LDMOS transistor of claim 1, wherein the islands have a substantially oval shape.

5. The LDMOS transistor of claim 1, wherein the islands have a substantially rectangular shape.

6. The LDMOS transistor of claim 1, wherein the islands extend substantially in parallel over a substantial length of the extended drain region.

7. The LDMOS transistor of claim 1, wherein the islands have a peak doping concentration of approximately $10^{17}$ cm$^{-3}$ to $10^{18}$ cm$^{-3}$.

8. The LOMOS transistor of claim 1, wherein the islands have a total charge approximately equal to a total charge of the extended drain region.

9. The LDMOS transistor of claim 1, wherein the islands have a doping concentration configured to deplete the extended drain region first vertically and then laterally.

10. The LDMOS transistor of claim 1, further comprising a region that has a conductivity type that is opposite to the extended drain region disposed below a portion of the extended drain region.

11. A method of fabricating an LDMOS transistor, comprising:
   forming a source region in a substrate;
   forming a channel region in the substrate;
   forming an extended drain region in the substrate, the extended drain region comprising a first segment extending from the channel region toward a drain contact region, a second segment extending deeper than the first segment toward the drain contact region and a third segment extending from the second segment to the drain contact region, the first segment being more lightly doped than the second segment and the second segment being more lightly doped than the third segment; and forming a plurality of islands in the third segment of the extended drain region that have a conductivity type that is opposite to the extended drain region, the islands having a depth less than a depth of the extended drain region.

12. The method of claim 11, wherein forming the extended drain region comprises implanting dopants into the extended drain region so that the islands extend substantially in parallel over a substantial length of the extended drain region.

13. The method of claim 11, wherein forming the extended drain region comprises implanting dopants into the extended drain region so that the islands have a peak doping concentration of approximately $10^{17}$ cm$^{-3}$ to $10^{18}$ cm$^{-3}$.

14. The method of claim 11, wherein forming the extended drain region comprises implanting dopants into the extended drain region so that the islands have a total charge approximately equal to a total charge of the extended drain region.

15. The method of claim 11, wherein forming the extended drain region comprises implanting dopants into the extended drain region so that the islands have a doping concentration configured to deplete the extended drain region first vertically and then laterally.

16. The method of claim 11, further comprising forming a region that has a conductivity type that is opposite to the extended drain region below a portion of the extended drain region.

17. The LDMOS transistor of claim 1, further comprising a pocket region formed below the first segment of the extended drain region near the channel region, the pocket region having the opposite conductivity type as the extended drain region.

18. The method of claim 11, further comprising forming a pocket region below the first segment of the extended drain region near the channel region, the pocket region having the opposite conductivity type as the extended drain region.

* * * * *